US008342121B2

(12) United States Patent
Koshimizu (10) Patent No.: US 8,342,121 B2
(45) Date of Patent: Jan. 1, 2013

(54) PLASMA PROCESSING APPARATUS

(75) Inventor: Chishio Koshimizu, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1068 days.

(21) Appl. No.: 12/056,567

(22) Filed: Mar. 27, 2008

(65) Prior Publication Data

US 2008/0236754 A1 Oct. 2, 2008

Related U.S. Application Data

(60) Provisional application No. 60/912,943, filed on Apr. 20, 2007.

(30) Foreign Application Priority Data

Mar. 29, 2007 (JP) ................................. 2007-088054

(51) Int. Cl.
*C23C 16/00* (2006.01)
*C23F 1/00* (2006.01)
*H01L 21/306* (2006.01)
(52) U.S. Cl. ................ 118/723 E; 156/345.47
(58) Field of Classification Search .................. 118/715, 118/722, 723 R, 723 E; 156/345.43, 345.44, 156/345.45, 345.46, 345.47
See application file for complete search history.

(56) References Cited

U.S. PATENT DOCUMENTS

| 6,818,560 B1 | 11/2004 | Koshimizu et al. |
| 2005/0016457 A1* | 1/2005 | Kawasaki et al. ......... 118/723 E |
| 2007/0187038 A1* | 8/2007 | Ren et al. ................. 156/345.43 |

FOREIGN PATENT DOCUMENTS

| JP | 2001-93884 | 4/2001 |
| JP | 2006-286813 A | 10/2006 |

* cited by examiner

*Primary Examiner* — Maureen Gramaglia
(74) *Attorney, Agent, or Firm* — Rothwell, Figg, Ernst & Manbeck, P.C.

(57) ABSTRACT

A plasma processing apparatus, which generates a plasma by a radio frequency discharge in a processing chamber, includes a first member having a first front surface facing the plasma, and a first mating surface extending from the first front surface; and a second member having a second front surface that forms an angled portion together with the first front surface of the first member in a manner to face the plasma, and a second mating surface facing the first mating surface of the first member with a gap therebetween. In the angled portion, an opening portion of gap and an inner portion extending from the opening portion to at least an intermediate location of the gap are oriented along an extended straight line that bisects an angle between the first front surface of the first member and the second front surface of the second member.

5 Claims, 4 Drawing Sheets

BACKGROUND ART

FIG.4

PLASMA PROCESSING APPARATUS

FIELD OF THE INVENTION

The present invention relates to a technique for performing a plasma processing on a target substrate; and, more particularly, to a plasma processing apparatus that generates a plasma by a radio frequency discharge in a processing chamber.

BACKGROUND OF THE INVENTION

A plasma processing apparatus is constructed to perform processes (e.g., etching, deposition, oxidation and sputtering) on a target substrate (e.g., a semiconductor wafer, a glass substrate for use in FPD or the like) in a hermetically sealable processing chamber serving as a vacuum chamber. In a single-wafer capacitively coupled plasma processing apparatus that is now widely in use, an upper and a lower electrode are disposed in parallel, and a substrate is mounted on the lower electrode. Further, a radio frequency is applied to at least one of the electrodes while supplying a processing gas to a space between the electrodes. Electrons are accelerated by a radio frequency electric field formed between the electrodes by the application of the radio frequency, and a plasma is generated by ionization caused by collision of the electrons and the processing gas. Then, a required treatment or microprocessing is performed on a surface of the substrate by radicals or ions in the plasma.

In the above plasma processing apparatus, gaseous reaction products or reaction by-products generated during the plasma processing are adhered to some parts in the processing chamber (especially surfaces of plasma-facing parts), and become solidified there as deposits. The plasma-facing parts in the processing chamber are usually as follows: a bottom surface of the upper electrode, a top surface of a peripheral portion of the lower electrode (susceptor) that encloses the substrate, a sidewall of the processing chamber and the like.

Besides, if the processing chamber is configured such that the upper electrode forms a united body with a ceiling of the processing chamber, a supporting member at the periphery of the upper electrode and the surface of the ceiling are also included in the plasma-facing parts. Moreover, in case of a configuration in which a ring-shaped focus ring larger than a substrate is installed on a top surface of the susceptor, or in which an outer peripheral surface of the susceptor is surrounded by a cylindrical wall, the focus ring or the wall is also included in the plasma-facing parts (see, e.g., Patent Document 1).

When the deposits adhered to the surfaces of the plasma-facing parts are removed due to, e.g., a separation of a film, the deposits become particles, thereby deteriorating a production yield. To avoid this problem, the deposits are removed from each part of the processing chamber by performing a cleaning process regularly or when necessary.

(Patent Document 1) Japanese Patent Application Publication No. 2001-93884

In the above plasma processing apparatus, it is required that, if two different parts that face the plasma space inside the processing chamber are adjoined to each other, an appropriate space or gap should be formed therebetween for the purpose of absorbing thermal expansion, preventing an electric conduction therebetween and an unwanted stress therebetween and the like. For example, when the disk-shaped upper electrode serving as a shower head for introducing a processing gas is to be attached to the ceiling of the processing chamber via a ring-shaped supporting member, an inner diameter of the supporting member is set slightly larger than an outer diameter of the upper electrode so that a gap can be formed between an outer peripheral surface of the upper electrode and an inner peripheral surface of the supporting member. Further, when the upper electrode is to be divided in a radial direction into an inner circular plate-shaped electrode and an outer ring-shaped electrode, a space may be formed therebetween in consideration of the above.

However, if a gap exists between the two plasma facing parts, deposits may enter the gap to thereby cause particle-related problems. In general, to remove the particles having entered a gap in the processing chamber, a manual cleaning does not work, and a gas cleaning or plasma cleaning is required. Especially in case of such a gap that faces the plasma space, the plasma cleaning is effective in that it takes advantage of ion sputtering effect. However, in a conventional plasma processing apparatus, if a joining portion of two plasma facing parts is angled or stepped, ions hardly enter the gap therebetween so that deposits in the gap is difficult to be removed even by the plasma cleaning.

SUMMARY OF THE INVENTION

In view of the above, the present invention provides a plasma processing apparatus for effectively removing deposits having entered a gap in an angled or stepped portion or the like that faces the plasma space.

In accordance with a first aspect of the present invention, there is provided a plasma processing apparatus that generates a plasma of a processing gas by a radio frequency discharge in a processing chamber capable of being depressurized to perform a specified plasma processing on a target substrate disposed at a specified location in the processing chamber by using the plasma. Herein, the plasma processing apparatus includes a first member having a first front surface facing the plasma in the processing chamber, and a first mating surface extending from the first front surface; and a second member having a second front surface that forms an angled portion together with the first front surface of the first member in a manner to face the plasma in the processing chamber, and a second mating surface extending from the second front surface to face the first mating surface of the first member with a gap therebetween.

In the angled portion, an opening portion of gap and an inner portion extending from the opening portion to at least an intermediate location of the gap are oriented along an extended straight line that bisects (most preferably, equally bisects) an angle between the first front surface of the first member and the second front surface of the second member.

In the above configuration, the gap between the first and the second mating surface is oriented along an extended straight line bisecting the angle of the angled portion between the first front surface of the first member and the second front surface of the second member, both front surfaces facing the plasma. Accordingly, the ions of the ion sheath can easily enter the gap so that the deposits in the gap can be removed efficiently by the ion sputtering.

In accordance with a second aspect of the present invention, there is provided a plasma processing apparatus that generates a plasma of a processing gas by a radio frequency discharge in a processing chamber capable of being depressurized to perform a specified plasma processing on a target substrate disposed at a specified location in the processing chamber by using the plasma. Herein, the plasma processing apparatus includes a first member having a first front surface facing the plasma in the processing chamber, and a first mating surface extending from the first front surface at an inclination angle therewith relative to a vertical direction; and a second member having a second front surface that forms an angled portion together with the first front surface of the first member in a manner to face the plasma in the processing chamber, and a second mating surface extending from the second front surface to face the first mating surface of the first member with a gap therebetween.

In the above configuration, the gap between the first and the second mating surface formed from the corner of the angled portion between the first plasma-facing front surface of the first member and the second plasma-facing front surface of the second member extends at an angle inclined with respect to a vertical or horizontal line. Thus, the ions of the ion sheath can easily enter the gap to that deposits in the gap can be removed efficiently by the ion sputtering.

It is preferable that each of the first mating surface and the second mating surface extends in a ring shape.

Further, it is preferable that the first mating surface lies on an outer peripheral surface of the first member, and the second mating surface lies on an inner peripheral surface of the second member.

Further, it is preferable that the plasma processing apparatus further includes a third member that hermetically seals the gap at the rear of the first and the second member when seen from a location of the plasma.

Further, it is preferable that the first member is an electrode to which a radio frequency power for plasma generation is supplied, and the second member is a supporting member attached to the processing chamber to support the electrode.

In accordance with a third aspect of the present invention, there is provided a plasma processing apparatus that generates a plasma of a processing gas by a radio frequency discharge in a processing chamber capable of being depressurized to perform a specified plasma processing on a target substrate disposed at a specified location in the processing chamber by using the plasma. Herein, the plasma processing apparatus includes a first member, formed of a conductor to which a radio frequency power is applied, having a first front surface facing the plasma in the processing chamber, and a first mating surface extending from the first front surface; and a second member, formed of a dielectric material or a grounded conductor, having a second front surface facing the plasma in the processing chamber in a manner to form a flat planar portion together with the first front surface of the first member, and a second mating surface extending from the second front surface to face the first mating surface of the first member with a gap therebetween.

In the flat planar portion, the first front surface and the first mating surface form an acute angle, and the second front surface and the second mating surface form an obtuse angle.

In the above configuration, the flat planar portion is formed substantially in the same plane by the side-by-side alignment of the first front surface of the first member and the second front surface of the second member, and the gap is formed between the first mating surface of the first member and the second mating surface of the second member that faces the first mating surface. Here, the first front surface and the first mating surface form an acute angle, and the second front surface and the second mating surface form an obtuse angle. Thus, the ions of the ion sheath can easily enter the gap so that deposits in the gap can be removed efficiently by the ion sputtering.

In accordance with the plasma processing apparatus of the present invention, it is possible to effectively remove deposits having entered a gap in an angled or stepped portion or the like facing the plasma space.

BRIEF DESCRIPTION OF THE DRAWINGS

The above and other objects and features of the present invention will become apparent from the following description of embodiments, given in conjunction with the accompanying drawings, in which.

DETAILED DESCRIPTION OF THE EMBODIMENT

The embodiments of the present invention will be described with reference to the accompanying drawings, which form a part hereof.

Figure 1:
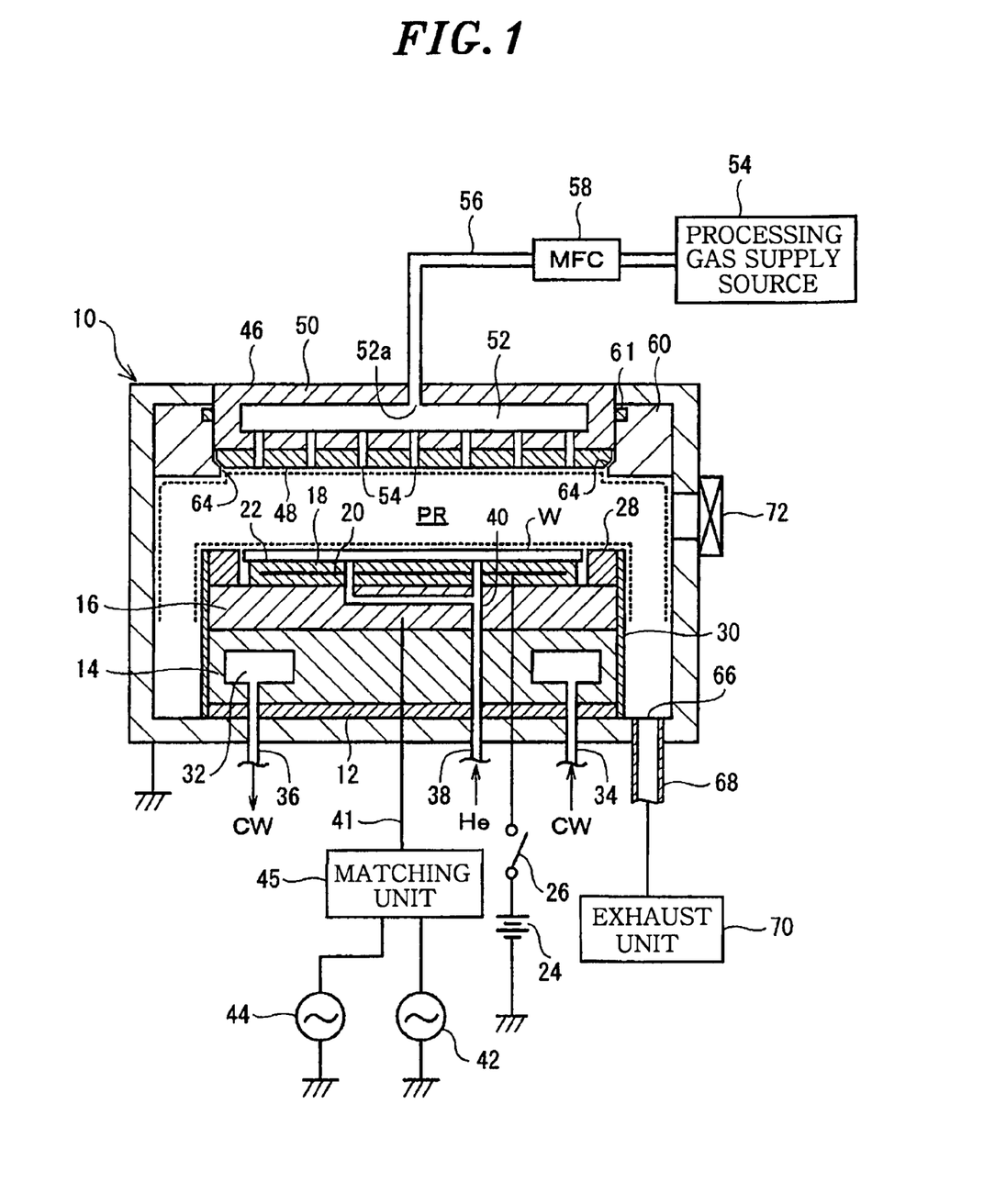
FIG. 1 is a vertical cross sectional view of a configuration of a plasma etching apparatus in accordance with an embodiment of the present invention.

FIG. 1 shows a configuration of a plasma etching apparatus in accordance with an embodiment of the present invention. This plasma etching apparatus is constructed as a capacitively coupled plasma etching apparatus of cathode-coupled type, and includes a cylindrical chamber (processing chamber) 10 made of a metal such as aluminum, stainless steel or the like. The chamber 10 is frame grounded.

A cylindrical susceptor supporting table 14 made of, e.g., aluminum, is provided on a bottom surface of the chamber 10 via an insulating plate 12. Further, a circular plate-shaped susceptor 16 made of, e.g., aluminum, is disposed on the susceptor supporting table 14. The susceptor 16 serves as a lower electrode and a mounting table, on which a target substrate, e.g., a semiconductor wafer W is mounted.

An electrostatic chuck 18 for holding the semiconductor wafer W by electrostatic adsorptive force is provided on a top surface of the susceptor 16. The electrostatic chuck 18 is formed by embedding an electrode 20 made of a conductive film in between a pair of insulation layers or insulation sheets 22. A DC power supply 24 is electrically connected to the electrode 20 via wiring and a switch 26. The semiconductor wafer W can be attracted to and held on the electrostatic chuck 18 by Coulomb force generated by a DC voltage applied from the DC power supply 24. Besides, a focus ring 28 made of, e.g., silicon, is provided on the top surface of the susceptor 16 to surround the electrostatic chuck 18. A cylindrical wall member 30 made of, e.g., quartz, is attached to side surfaces of the susceptor supporting table 14, the susceptor 16 and the focus ring 28.

A ring-shaped coolant reservoir or coolant passageway 32 extending in, e.g., a circumferential direction, is provided in the susceptor supporting table 14 in order to control a temperature of the semiconductor wafer W mounted on the susceptor 16. A coolant of a specified temperature, e.g., cooling water, supplied from a chiller unit (not shown) located outside is circulated in the coolant reservoir via lines 34 and 36. Moreover, in order to increase the accuracy of controlling the temperature of the wafer, a thermally conductive gas, e.g., He gas, is supplied from a thermally conductive gas supply unit (not illustrated) to a space between the electrostatic chuck 18 and the semiconductor wafer W via a gas supply line 38 and a gas channel 40.

A first and a second radio frequency power supply 42 and 44 are electrically connected to the susceptor 16 via a matching unit 45 and a power feed rod 41. Here, the first radio frequency power supply 42 outputs a first radio frequency power having a preset frequency, e.g., 40 MHz, for generating a plasma. Meanwhile, the second radio frequency power supply 44 outputs a second radio frequency power having a preset frequency, e.g., 2 MHz, for attracting ions to the semiconductor wafer W on the susceptor 16. The matching unit 45 includes a first matching device for matching an impedance between the first radio frequency power supply 42 and a load (mainly, an electrode, a plasma and a chamber) and a second matching device for matching an impedance between the second radio frequency power supply 44 and the load.

A shower head 46 facing the susceptor 16 in parallel is provided at a ceiling portion of the chamber 10, and serves as an upper electrode of a ground potential. The shower head 46 has an electrode plate 48 facing the susceptor 16 and an electrode main body 50 for holding the electrode plate 48 in such a manner that the electrode plate 48 can be attached to and detached from a rear surface of the electrode main body 50. Further, a gas chamber 52 is provided in the electrode main body 50, and a plurality of gas discharge openings 54 extending from the gas chamber 52 toward susceptor 16 are formed in the electrode plate 48 and the electrode main body 50.

A space formed between the electrode plate 48 and the susceptor 16 becomes a plasma space PR for plasma generation or plasma processing. A gas supply line 56 from a processing gas supply unit 54 is connected to a gas inlet port 52*a* provided at an upper portion of the gas chamber 52. In addition, a mass flow controller (MFC) 58 is provided in the gas supply line 56.

In the upper electrode (shower head) 46, the electrode plate 48 is made of, e.g., Si or SiC, and the electrode main body 50 is made of, e.g., alumite treated aluminum. The electrode plate 48 is attachably and detachably coupled to the electrode main body 50 by means of, e.g., bolts (not shown). A ring-shaped electrode support 60 is inserted between an outer peripheral surface of the upper electrode 46 and an inner wall of the chamber 10, and the electrode main body 50 is coupled to the electrode support 60 by means of, e.g., bolts (not illustrated).

An outer peripheral surface of the electrode main body 50 and an inner peripheral surface of the electrode support 60 are in contact with and sealed by a seal member such as an O-ring 61. At this time, a gap 64 or a space of a width ranging from, e.g., about 0.1 to 3 mm, is formed between the outer peripheral surface of the electrode plate 48 and the inner peripheral surface of the electrode support 60. The electrode support 60 may be made of a conductor, e.g., alumite treated aluminum, or an insulator, e.g., ceramic. The electrode support 60 made of a conductor serves as if an extended portion of the upper electrode 46 prolonged in a radial direction.

In a ring-shaped space formed by the sidewall of the chamber 10, the susceptor supporting table 14 and the susceptor 16 is provided an exhaust space, wherein a gas exhaust port 66 is provided at a bottom portion of the exhaust space. A gas exhaust unit 70 is connected to the gas exhaust port 66 via a gas exhaust line 68. The gas exhaust unit 70 has a vacuum pump such as a turbo-molecular pump or the like, so that a plasma space in the chamber 10 can be depressurized to a required vacuum level. Attached to a sidewall of the chamber 10 is a gate valve 72 for opening and closing a transfer port of the semiconductor wafer W.

When performing the etching in this plasma processing apparatus, the semiconductor wafer W to be processed is loaded into the chamber 10 by opening the gate valve 72 and then mounted on the electrostatic chuck 18. Next, an etching gas (generally, a gaseous mixture) is introduced into the chamber 10 at a preset flow rate and flow rate ratio from the processing gas supply unit 54, and a pressure inside the chamber 10 is set to be a predetermined level by using the gas exhaust unit 701.

Then, the first and the second radio frequency power supply 42 and 44 are turned on to output the first radio frequency (40 MHz) and the second radio frequency (2 MHz) at respective specific power levels. These frequencies are applied to the susceptor 16 via the matching unit 45 and the power feed rod 41. Thereafter, the switch 26 is turned on, and the thermally conductive gas (He gas) is trapped by electrostatic adsorptive force in a contact interface between the electrostatic chuck 38 and the semiconductor wafer W. The etching gas discharged from the shower head 46 is converted into a plasma between both electrodes 16 and 46 by a radio frequency discharge, and the main surface of the semiconductor wafer W is etched by radicals or ions generated in the plasma.

Hereinafter, configurations and operations of features of the plasma etching apparatus of this embodiment will be described in detail.

Figure 2:
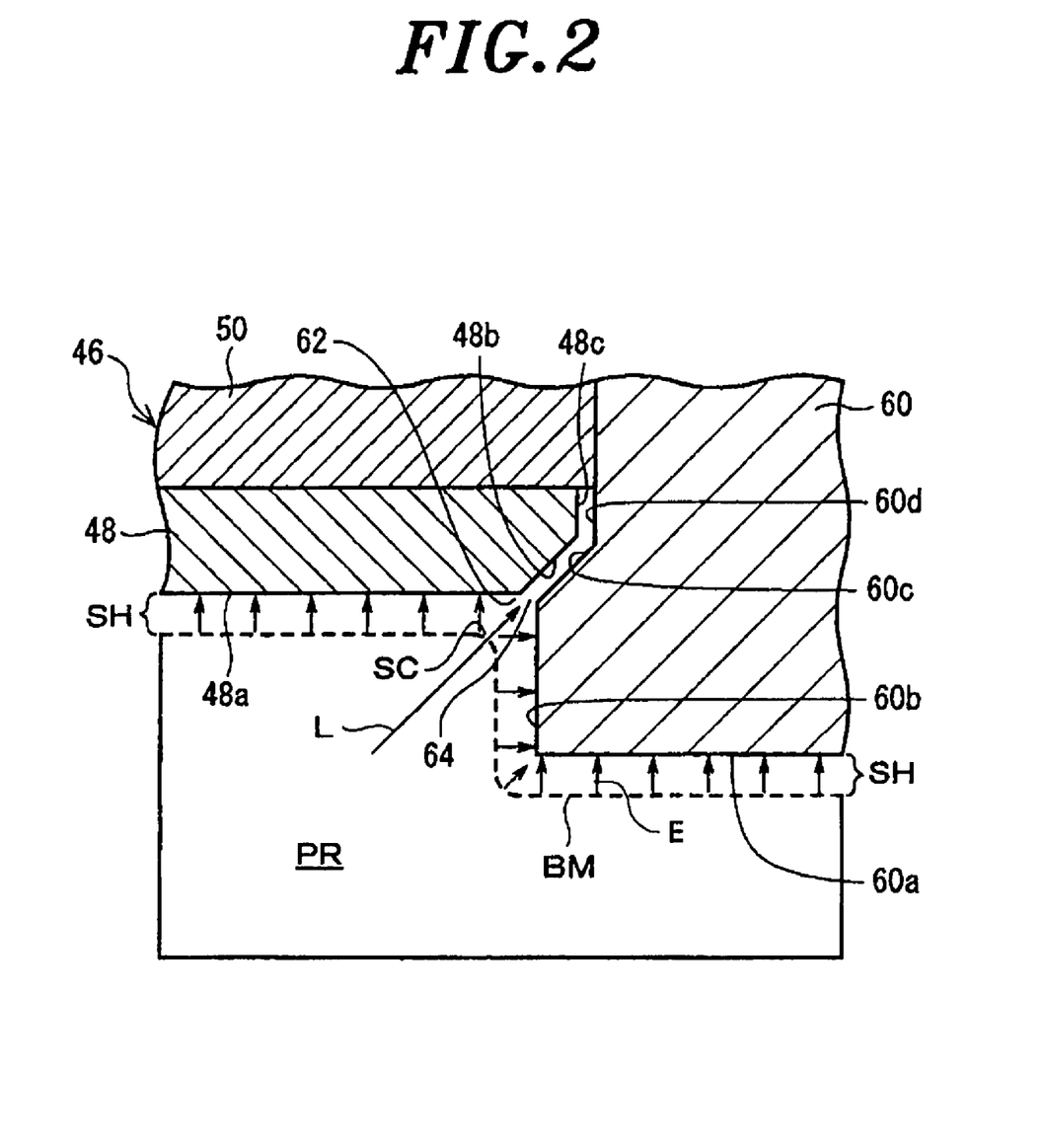
FIG. 2 provides a fragmentary enlarged cross sectional view of principal parts of the embodiment (structures in a vicinity of a focus ring on a top surface of a susceptor)

FIG. 2 depicts an enlarged view of a configuration at the vicinity of the gap 64 formed between the electrode plate 48 of the upper electrode 46 and the electrode support 60. As illustrated therein, a bottom surface of the electrode support 60 extends a few centimeters further downward (i.e., toward the susceptor 16) than the bottom surface of the electrode plate 48. In this configuration, since the electrode support 60 serving as if an extended portion of the upper electrode 46 (i.e., serving as a radio frequency electrode) extends downward further than the electrode plate 48, the intensity of an electric field is higher directly under the electrode support 60 to thereby achieve a uniform plasma density distribution above the semiconductor wafer W relative to the redial direction.

To be more specific, the electrode support 60 has a bottom surface 60*a* extending in a substantially horizontal direction; a first vertical inner peripheral surface 60*b* extending vertically upward from an inner peripheral edge of the bottom surface 60*a*; an inclined inner peripheral surface 60*c* extending obliquely upward (more specifically, extending outward in a radial direction at an angle of about 45° with respect to a vertical or horizontal line) from an upper edge of the first vertical inner peripheral surface 60*b*; and a second vertical inner peripheral surface 60*d* extending vertically upward from an upper edge of the inclined inner peripheral surface 60*c*.

The electrode plate 48 has a bottom surface 48*a* extending substantially in a horizontal direction; an inclined outer peripheral surface 48*b* extending obliquely upward at an angle of about 45° with respect to a vertical or horizontal line from the outer peripheral edge of the bottom surface 48*a* such that the inclined outer peripheral surface 48*b* is aligned in parallel with the inclined inner peripheral surface 60*c* of the electrode support 60; and a vertical outer peripheral surface 48*c* extending vertically upward from an upper edge of the inclined outer peripheral surface 48*b*, being oriented in parallel with the second vertical inner peripheral surface 60*d* of the electrode support 60.

Here, an angled portion 62 is formed at an angle of approximately 90° between the substantially horizontal bottom surface 48*a* of the electrode plate 48 and the substantially vertical first vertical inner peripheral surface 60*b* of the electrode support 60. Further, the gap 64 is formed with a uniform width between the inclined outer peripheral surface 48*b* of the electrode plate 48 and the inclined inner peripheral surface 60c of the electrode support 60 and also between the vertical outer peripheral surface 48c of the electrode plat 48 and the second vertical outer peripheral surface 60d of the electrode support 60.

When the above plasma etching is being carried out, most of the gaseous reaction products generated on the main surface of the semiconductor wafer W are exhausted via the gas exhaust port 66 provided at the bottom of the chamber 10. However, a part of the gaseous reaction products are adhered as deposits onto some parts in the chamber 10 (especially the upper electrode 46, the electrode support 60, the inner wall of the chamber 10, the front surface of the focus ring 28 and the like, all facing the plasma space PR). Further, the deposits may enter the gap 64 between the electrode plate 48 and the electrode support 60.

Further, during the above plasma etching, the plasma generated in the plasma space PR is diffused to subsequent regions, so that an ion sheath SH is formed on a boundary between the plasma and parts that contact the plasma. The ion sheath SH is an electric field space created because the velocity of electrons is much faster than that of ions. In the ion sheath, a voltage or potential change between the plasma and its contacting parts takes place. Here, electric force lines or electric field vectors E in the ion sheath SH extend from a sheath-bulk plasma interface BM in a direction normal thereto. The ions in the plasma are accelerated in the respective positions according to the electrical vectors E in the ion sheath SH, and collide with or come into surfaces directly opposite thereto.

As shown in FIG. 2, ions moving upward in a substantially vertical direction collide with or come into the bottom surface 48a of the electrode plate 48 from a horizontal plane of the ion sheath SH located directly opposite thereto. Further, ions moving in a substantially horizontal direction collide with or come into the first vertical inner peripheral surface 60b of the electrode support 60 from a vertical plane of the ion sheath SH located directly opposite thereto. Furthermore, ions moving upward in a substantially vertical direction collide with or come into the bottom surface 60a of the electrode support 60 from a horizontal plane of the ion sheath SH.

In this manner, the ion sputtering effect of the above prevents deposits from being adhered to the bottom surface 48a of the electrode plate 48, the first vertical inner peripheral surface 60b and the bottom surface 60a of the electrode support 60, and the first vertical inner peripheral surface 60b of the electrode support 60. Further, even when the deposits are adhered thereto, they can be easily removed.

Further, ions moving obliquely upward at an angle of about 45° from an ion sheath corner (angled portion) SC enter deep into the gap 64, which is formed between the electrode plate 48 and the electrode support 60 to face the ion sheath corner, directly from an opening portion of the gap 64. Thus, if there are deposits adhered to the inner surface of the gap 64, they are removed to the outside of the gap 64 by the ion sputtering effect.

As discussed above, this plasma etching apparatus is configured such that the gap 64 at the angled portion (or a stepped portion) 62 formed between the electrode plate 48 and the electrode support 60, both facing the plasma space PR, is oriented at a specific angle of inclination (e.g., 45°). In other words, the gap 64 (especially the opening portion and its vicinity) is oriented along an extended straight line L that equally bisects an angle (e.g., 900) of the angled portion 62. Accordingly, the ions in the ion sheath SH can enter directly into the gap 64, and the deposits on the inner surface of the gap 64 can be effectively removed by the ion sputtering effect (as effectively as in case of the electrode surface or the inner wall of the chamber).

Further, in this plasma etching apparatus, the plasma cleaning can be performed by using, e.g., a $CF_4$-based gas, between lot processes. At this time, as in the above plasma processing, the ion sputtering effect is also achieved to the inner surface of the gap 64, and thereby the cleaning performance can be improved.

Figure 3:
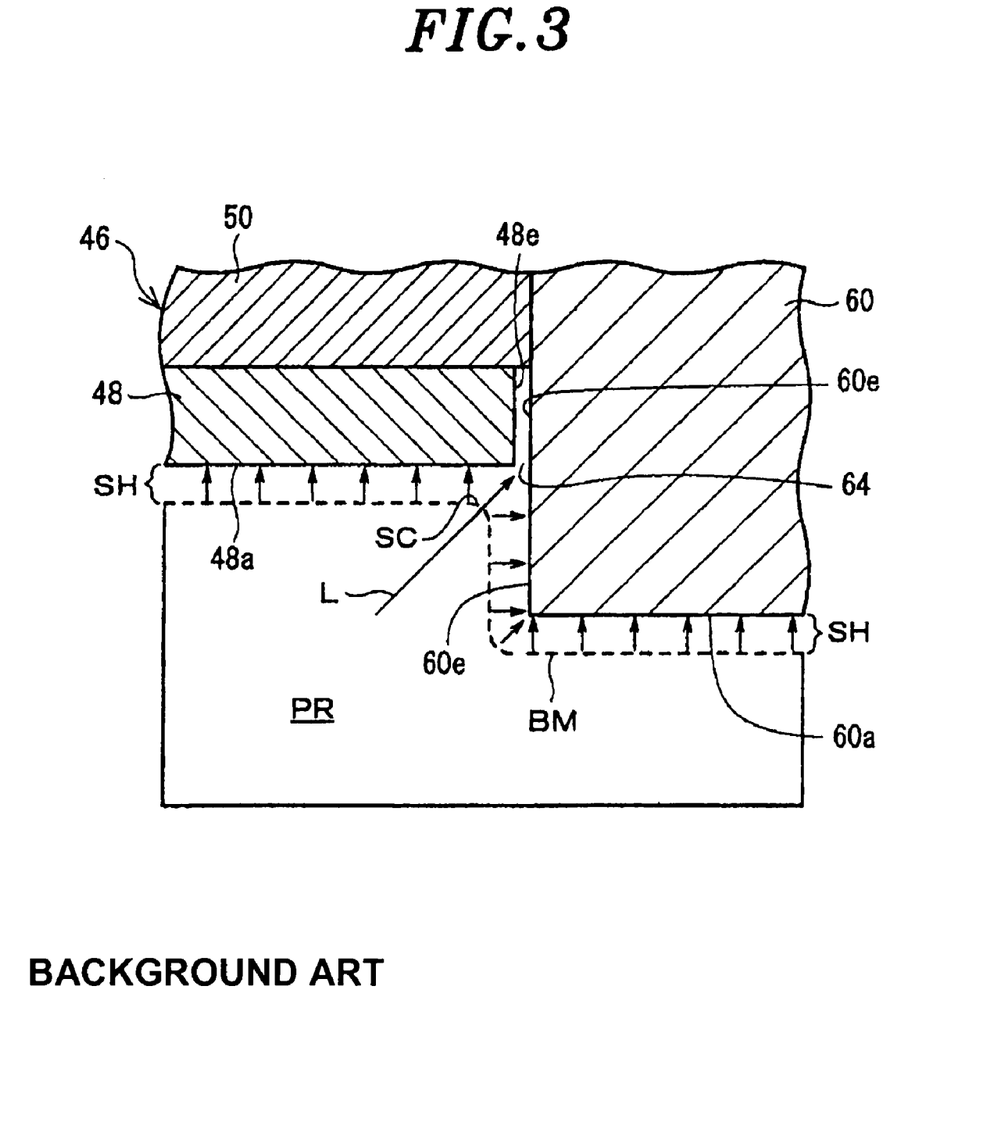
FIG. 3 shows a fragmentary enlarged cross sectional view of a structure of a comparative example in accordance with a prior art.

In comparison, the structure of a conventional part mating surface is as follows: the outer peripheral surface 48e of the electrode plate 48 and the inner peripheral surface 60e of the electrode support 60 are formed to be vertically oriented, and the gap 64 between the electrode plate 48 and the electrode support 60 is formed along a vertical line extending from an opening portion of the gap 64 to an innermost portion of the gap 64, as illustrated in FIG. 3. In this structure, ions moving obliquely upward at an angle of about 45° from the ion sheath corner (angled portion) cannot go directly into the gap 64 that faces the ion sheath corner. Therefore, deposits in the inner surface of the gap 64 cannot be removed by the ion sputtering.

In the above embodiment, the angled portion 62 is formed with an angle of about 90° between the electrode plate 48 of the upper electrode 46 and the electrode support 60, and the gap 64 (or the mating surfaces adjacent to the angled portion 62) is formed at an inclination angle of about 45°. However, the angles can be changed. For example, if, although not illustrated, the angled portion 62 is formed at an angle of about 150°, it is preferable that the gap 64 is oriented at an inclination angle of about 75° with respect to the bottom surface 48a of the electrode plate 48.

In the above embodiment, it is most preferable that the gap 64 is oriented along a straight line that equally bisects the angle of the angled portion 62. However, such an orientation may be changed slightly. In principle, the advantageous effects practically equivalent to those of the above embodiment can be achieved so long as the configuration is as follows: the opening portion of the gap 64 and an inner portion of the gap 64 that extends to at least an intermediate location in the gap 64 are oriented along an extended straight line that bisects at a specific ratio the angle formed by the bottom surface 48a of the electrode plate 48 and the first vertical inner peripheral surface 60b of the electrode support 60.

In addition, the present invention is not restricted to the above-discussed structure of the mating surfaces between the electrode plate 48 of the upper electrode 46 and the electrode support 60, and can also be applied to other structures of mating surfaces that face the plasma space PR in the chamber 10. For example, the present invention can also be applied to a configuration, although not shown, in which the upper electrode (shower head) 46 is divided in a radial direction into an inner electrode of circular plate shape and an outer electrode of ring shape, and a gap is formed therebetween.

The plasma etching apparatus of the above embodiment is configured as a lower electrode dual frequency application type in which the first frequency (40 MHz) and the second frequency (2 MHz) are commonly applied to the susceptor 16. In the above, the respective frequencies of the first and the second radio frequency power used in the above embodiment are merely examples, and other frequencies can be selected instead thereof according to the process. In general, the frequency of the first radio frequency power for plasma generation is chosen to be greater than or equal to 13.56 MHz, and that of the second radio frequency power for ion attraction to the substrate or the upper electrode is chosen to be smaller or equal to 13.56 MHz.

Further, the present invention is not limited to the lower side dual frequency application type, and can also be applied to one in which a single radio frequency power of an appropriate frequency is applied to the susceptor 16, another one in which two radio frequency powers of different frequencies are applied to the susceptor 16 and the upper electrode 46, respectively, or the like.

Figure 4:
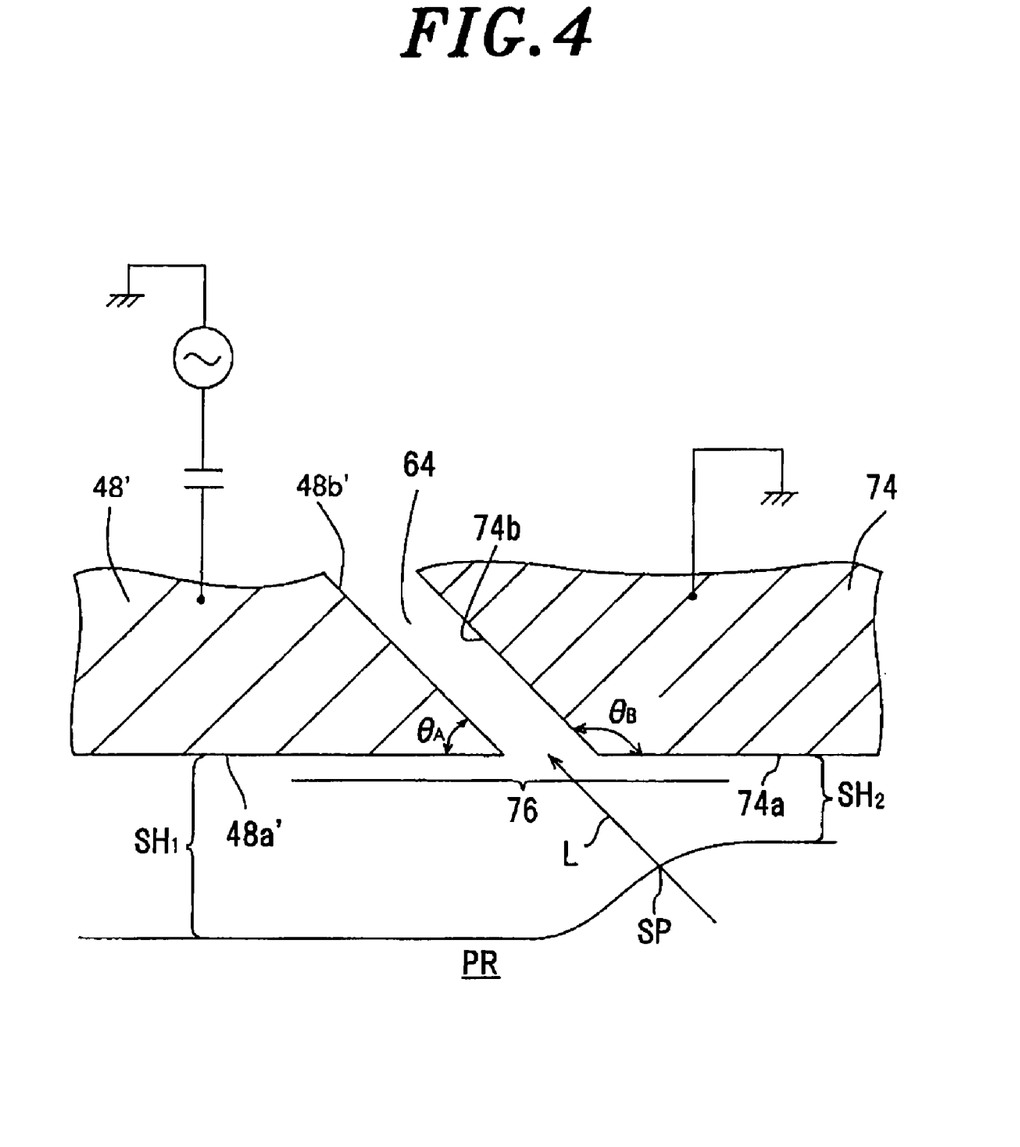
FIG. 4 presents a fragmentary enlarged cross sectional view of principal parts of another embodiment.

Further, in a plasma etching apparatus in which a radio frequency power is applied to the upper electrode 46, relevant parts may be constructed as shown in FIG. 4 in accordance with another embodiment of the present invention.

FIG. 4 provides an enlarged view of a configuration at the vicinity of the gap 64 between an electrode plate 48' of the upper electrode 46 and a conductive ring 74 that encloses the electrode plate 48'. In this example, the electrode plate 48' is an electrode to which a radio frequency power is applied, and the ring 74 is grounded.

To be more specific, the ring 74 has a bottom surface 74a oriented in a substantially horizontal direction and an inclined inner peripheral surface 74b extending obliquely upward (more specifically, oriented in a radially inward direction at an inclination angle of about 135° or 45° with respect to the horizontal line) from an inner peripheral edge of the bottom surface 74a. The electrode plate 48' has a bottom surface 48a' oriented in a substantially horizontal direction and an inclined outer peripheral surface 48b' extending obliquely upward at an inclination angle of about 135° or 45° with respect to the horizontal line from an outer peripheral edge of the bottom surface 48a'. Herein, the inclined outer peripheral surface 48b' is aligned in parallel with the inclined inner peripheral surface 74b of the ring 74.

Here, the substantially horizontal bottom surface 48a' of the electrode plate 48, together with the substantially horizontal bottom surface 74a of the ring 74, forms a flat planar portion 76 lying substantially in a same plane. Furthermore, the gap 64 is formed with a substantially uniform width between the inclined outer peripheral surface 48b' of the electrode plate 48' and the inclined inner peripheral surface 74b of the ring 74.

While the above plasma etching is being carried out, the ion sheath SH as discussed above is formed. However, in the ion sheath SH in this example, although the flat planar portion 76 is formed by the electrode plate 48' and the ring 74, a sheath portion SH1 located directly under the bottom surface 48a' of the electrode plate 48' has a thickness different from that of a sheath portion SH2 located directly under the bottom surface 74a of the ring 74. More specifically, the thickness of the ion sheath portion SH1 is greater than that of the ion sheath portion SH2. This is because the electrode plate 48' is an electrode to which the radio frequency power is applied, whereas the ring 74 is grounded. Accordingly, a stepped portion SP is formed in the ion sheath near the opening portion of the gap 64 under the planar portion 76.

Ions moving obliquely upward at an angle of, e.g., about 135° or 45° from an ion sheath SP go deep into the gap 64 between the electrode plate 48 and the electrode support 60 directly from the opening portion that faces the stepped portion SP in the ion sheath. If there are deposits adhered to an inner surface of the gap 64, they are removed outwardly from the gap 64 by the ion sputtering effect.

As set forth above, in the plasma etching apparatus of this example, the gap 64 between the electrode plate 48' and the ring 74, both facing the plasma space PR, is formed at a preset inclination angle (e.g., 135° or 45°). As a result, the ions in the stepped portion SP in the ion sheath can go directly into the gap 64, and the deposits in the inner surface of the gap 64 can be removed efficiently by the ion sputtering effect.

In this example, the inclined outer peripheral surface 48b' is inclined at an angle of 135° with respect to the bottom surface 48a' of the electrode plate 48', and the inclined inner peripheral surface 74b is inclined at an angle of 45° with respect to the bottom surface 74a of the ring 74. However, the present invention is not limited to the above example.

The thicknesses of the ion sheath portions SH1 and SH2 vary according to the power supplied from the radio frequency power supply, the kind of gas, the pressure or the like. Preferably, the thicknesses of the ion sheath portions SH1 and SH2 are measured in advance, and then, the angle between the bottom surface 48a' and the inclined outer peripheral surface 48b' of the electrode plate 48' and that between the bottom surface 74a and the inclined inner peripheral surface 74b of the ring 74 are determined based on a typical or median thickness of the ion sheath portions SH1 an SH2. In the configuration of FIG. 4, an angle $\theta_A$ between the bottom surface 48a' and the inclined outer peripheral surface 48b' of the electrode plate 48' is an acute angle, and an angle $\theta_B$ between the bottom surface 74a and the inclined inner peripheral surface 74b of the ring 74 is an obtuse angle.

Although the ring 74 is a grounded conductor in the above example, it may also be an insulator such as quartz, ceramic, resin or the like.

Further, if the ring 74 projects toward the plasma space PR further than the electrode plate 48' so that the planar portion 76 is not formed (i.e., if the electrode plate 48' and the ring 74 form an angled portion as in case of the electrode plate 48 and the electrode support 60 shown in FIG. 2), the configuration becomes similar to that of FIG. 2. In this case, although not illustrated, the angle $\theta_A$ formed by the bottom surface 48a' and the inclined outer peripheral surface 48b' of the electrode plate 48' is an obtuse angle, and the inclined inner peripheral surface 74b of the ring 74 is aligned in parallel with the inclined peripheral surface 48b' of the electrode plate 48' in such a manner that the gap 64 is formed therebetween.

The present invention is not limited to the plasma etching, but may also be applied to other plasma processing such as plasma CVD, plasma oxidation, plasma nitrification, sputtering and the like. Further, as a substrate, it is possible to use, instead of a semiconductor wafer, a photomask, a CD substrate, a printed circuit board, various substrates for plat panel display or the like.

While the invention has been shown and described with respect to the embodiments, it will be understood by those skilled in the art that various changes and modification may be made without departing from the scope of the invention as defined in the following claims.

What is claimed is:

1. A plasma processing apparatus that generates a plasma of a processing gas by a radio frequency discharge in a processing chamber capable of being depressurized to perform a specified plasma processing on a target substrate disposed at a specified location in the processing chamber by using the plasma, the plasma processing apparatus comprising:

a first member having a first front surface facing the plasma in the processing chamber and a first mating surface having a first inclined surface extending obliquely upward from the first front surface and a first vertical surface extending vertically upward from the first inclined surface; and a second member having a second front surface that forms an angled portion together with the first front surface of the first member in a manner to face the plasma in the processing chamber and a second mating surface having a second inclined surface extending obliquely upward from the second front surface and a second vertical surface extending vertically upward from the second inclined surface,
wherein the first inclined surface and the first vertical surface face the second inclined surface and the second vertical surface, respectively, with a gap therebetween, and
wherein the gap has an opening at the angled portion and an inner portion of the gap between the first inclined surface and the second inclined surface is oriented along an extended straight line that substantially equally bisects an angle between the first front surface and the second front surface.

2. The plasma processing apparatus of claim 1, wherein each of the first mating surface and the second mating surface extends in a ring shape.

3. The plasma processing apparatus of claim 2, wherein the first mating surface lies on an outer peripheral surface of the first member, and the second mating surface lies on an inner peripheral surface of the second member.

4. The plasma processing apparatus of claim 1, further comprising:
a third member that hermetically seals the gap at the rear of the first and the second member when seen from a location of the plasma.

5. The plasma processing apparatus of claim 1, wherein the first member is an electrode to which a radio frequency power for plasma generation is supplied, and the second member is a supporting member attached to the processing chamber to support the electrode.

* * * * *